US012609181B2

(12) United States Patent
Sharma et al.

(10) Patent No.: US 12,609,181 B2
(45) Date of Patent: Apr. 21, 2026

(54) ERROR HANDLING DURING A MEMORY COMPACTION PROCESS

(71) Applicant: Sandisk Technologies, Inc., Milpitas, CA (US)

(72) Inventors: Ravi Dutt Sharma, Bangalore (IN); Tusarkanta Champatiray, Bangalre (IN); Yogendra Sikarwar, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 245 days.

(21) Appl. No.: 18/359,637

(22) Filed: Jul. 26, 2023

(65) Prior Publication Data

US 2024/0386984 A1 Nov. 21, 2024

Related U.S. Application Data

(60) Provisional application No. 63/502,470, filed on May 16, 2023.

(51) Int. Cl.
G11C 29/52 (2006.01)
G11C 7/10 (2006.01)
G11C 29/02 (2006.01)

(52) U.S. Cl.
CPC ............ G11C 29/52 (2013.01); G11C 7/1069 (2013.01); G11C 29/022 (2013.01)

(58) Field of Classification Search
CPC ...... G11C 29/52; G11C 7/1069; G11C 29/022

USPC ...................................................... 365/185.09
See application file for complete search history.

(56) References Cited

U.S. PATENT DOCUMENTS

| | | | | | |
|---|---|---|---|---|---|
| 7,096,324 | B1 * | 8/2006 | May | ........................ | G06F 30/34 |
| | | | | | 711/149 |
| 9,513,991 | B2 * | 12/2016 | Rho | ..................... | G06F 11/1048 |
| 11,650,795 | B2 * | 5/2023 | Zalivaka | ................. | G06F 7/588 |
| | | | | | 708/250 |
| 2014/0115419 | A1 * | 4/2014 | Ahn | .................... | G06F 11/1048 |
| | | | | | 714/799 |

FOREIGN PATENT DOCUMENTS

| | | | | | | |
|---|---|---|---|---|---|---|
| AU | 2014200492 | A | * | 10/2014 | ........... | G11C 29/028 |
| CN | 202010294432 | A | * | 10/2020 | ............ | G11C 16/26 |
| DE | 102005052698 | A1 | * | 5/2006 | ............ | G11C 29/76 |

* cited by examiner

*Primary Examiner* — Amir Zarabian
(74) *Attorney, Agent, or Firm* — Dentons Durham Jones Pinegar

(57) ABSTRACT

A memory compaction process utilizes unused or reserved memory locations in an intermediate memory block to temporarily store data that has been read and/or corrected from a source memory block. As data may be read from the source memory block in different reading cycles, this process repeats until all of the data of the source memory block is ready to be written to a destination memory block. During a last or final reading cycle or phase, any data remaining in the source memory block is read from the source memory block and transferred to a destination memory block, along with the data that is stored in the reserved memory locations of the intermediate memory block.

20 Claims, 8 Drawing Sheets

100

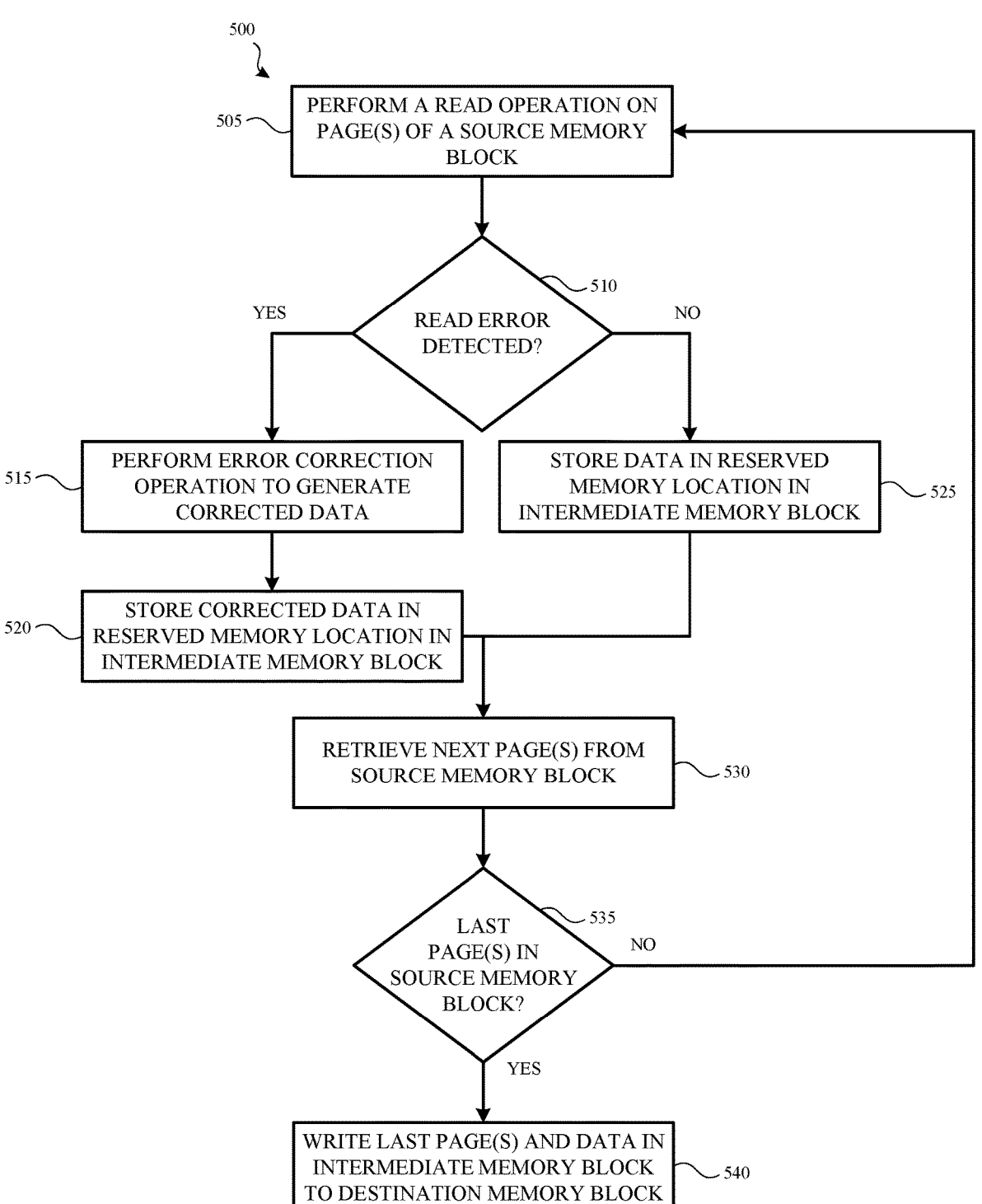

500

505 — PERFORM A READ OPERATION ON PAGE(S) OF A SOURCE MEMORY BLOCK

510
READ ERROR DETECTED?

YES

NO

515 — PERFORM ERROR CORRECTION OPERATION TO GENERATE CORRECTED DATA

525 — STORE DATA IN RESERVED MEMORY LOCATION IN INTERMEDIATE MEMORY BLOCK

520 — STORE CORRECTED DATA IN RESERVED MEMORY LOCATION IN INTERMEDIATE MEMORY BLOCK

530 — RETRIEVE NEXT PAGE(S) FROM SOURCE MEMORY BLOCK

535
LAST PAGE(S) IN SOURCE MEMORY BLOCK?

NO

YES

540 — WRITE LAST PAGE(S) AND DATA IN INTERMEDIATE MEMORY BLOCK TO DESTINATION MEMORY BLOCK

FIG. 5

ERROR HANDLING DURING A MEMORY COMPACTION PROCESS

CROSS-REFERENCE TO RELATED APPLICATIONS

The present application claims priority to U.S. Provisional Application 63/502,470 entitled "ERROR HANDLING DURING A MEMORY COMPACTION PROCESS", filed May 16, 2023, the entire disclosure of which is hereby incorporated by reference in its entirety.

BACKGROUND

During execution of processes on a computing system, memory from a memory pool is allocated for use. Some of the allocated memory may later be freed and returned to the memory pool. As a result, over time, the memory pool becomes fragmented. In order to address memory fragmentation, a memory compaction process is executed so that all available free memory is contiguous in the memory pool. Generally, the memory compaction process is executed while a garbage collection (GC) process is being performed.

In current solutions, the memory compaction process includes reading data of multiple pages stored in a wordline (WL) of a source memory block and correcting data for any read operation error that is detected. If a read operation error is detected, the data is corrected using a read error handling operation. Reading data and performing a read error handling operation on a page generally does not leave any time in a cycle (or a phase) to read other pages. Therefore, the data that is read and corrected is typically written to a WL of a destination memory block for temporary storage. Since the WL of the destination memory block generally stores multiple pages per bit-cell, and data corresponding to only one page is available for writing in the WL of the destination memory block, padded data is added as the remaining pages.

Similarly, if a read operation error occurred while reading other pages, additional WLs of the destination memory block are used for temporarily storing corrected data and/or padded data associated with these pages until all pages from the source memory block are read and/or corrected. All of the retrieved and/or the corrected data is then written together and stored in the destination memory block. However, this process requires a number of different read operations, write operations, reread operations and rewrite operations which is time consuming and consumes a lot of storage resources in the destination memory block.

Accordingly, it would be advantageous to reduce the number of reads and/or writes required to perform a memory compaction process.

SUMMARY

The present application describes a memory compaction process. The memory compaction process utilizes unused or reserved memory locations in an intermediate memory block to temporarily store data that has been read and/or corrected from a source memory block. In an example, reading data from the source memory block may occur in different reading cycles or phases. Thus, this process may repeat until all of the data of the source memory block is ready to be written to a destination memory block. During a last or final reading cycle or phase, any data remaining in the source memory block is read from the source memory block and transferred to a destination memory block, along with the data from the intermediate memory block.

Accordingly, the present application describes a method that includes performing a read operation on multiple pages of a source memory block and determining whether a read operation error has occurred with respect to a first page of the multiple pages. Based, at least in part, on determining the read operation error has occurred, an error correction operation is performed on data associated with the first page to generate corrected data. The corrected data is stored in a reserved memory location in an intermediate memory block. The corrected data is read from the reserved memory location in the intermediate memory block and data associated with a second page of the multiple pages is read from the source memory block and is stored in a destination memory block.

The present application also describes a system including a controller and a memory communicatively coupled to the controller. The memory stores instructions that, when executed by the controller, causes the controller to perform a read operation on a set of pages stored at a memory location of a source memory block. The instructions may also cause the controller to determine whether a read operation error has occurred on the set of pages. In an example, the set of pages includes a first subset of pages, a second subset of pages, and a third subset of pages. The instructions may also cause the controller to perform an error correction operation on data associated with each page of the first subset of pages to generate corrected data for each page of the first subset of pages for which a read operation error has occurred. The instructions may also cause the controller to store the corrected data of each page of the first subset of pages and to store data associated with each page of the second subset of pages in respective reserved memory locations in an intermediate memory block. The instructions may also cause the controller to write data stored in the intermediate memory block, and data associated with the third subset of pages stored in the source memory block, to a memory location in a destination memory block.

The present application also describes a non-volatile data storage device including at least one memory die. The non-volatile data storage device includes means for performing a read operation on multiple pages of a first memory block of the at least one memory die and means for determining whether a read operation error has occurred with respect to a first page of the multiple pages. The non-volatile data storage device also includes means for performing an error correction operation on data associated with the first page, based, at least in part, on a determination that the read operation error has occurred on the first page. The non-volatile data storage device also includes means for storing corrected data in a reserved memory location in an intermediate memory block after the error correction operation on data associated with the first page is performed. The non-volatile data storage device also includes means for writing, in a second memory block of the at least one memory die, the corrected data read from the reserved memory location in the intermediate memory block and data associated with a second page of the multiple pages read from the first memory block.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIG. 5 illustrates a method for performing a memory compaction process for a memory block of a memory die according to an example.

DETAILED DESCRIPTION

Figure 1:
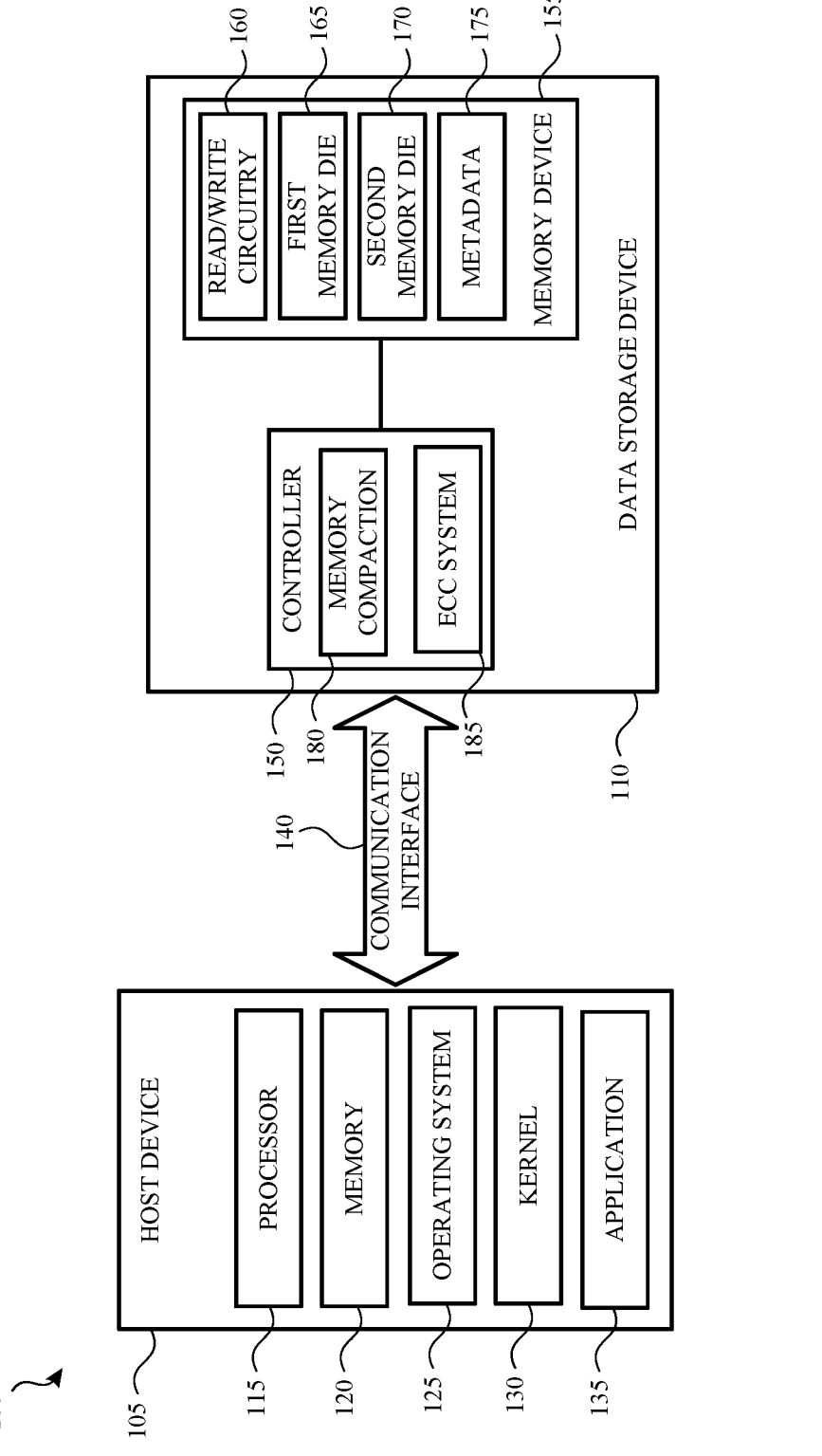
FIG. 1 is a block diagram of a system that includes a host device and a data storage device according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems, or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

The present application relates to a memory compaction process for a data storage device. The memory compaction process may be performed during a garbage collection (GC) process or during an idle time of a computing device and/or data storage device. During the memory compaction process, used and unavailable memory areas located between available and free memory areas, are moved to create contiguous available and free memory areas. To generate the contiguous memory area, data written in multiple pages of a memory block (referred to herein as a source memory block) is read and subsequently written to another memory block (referred to herein as a destination memory block). In an example, the source memory block and the destination memory block may be the same memory block. In another example, the source memory block and the destination memory block may be different memory blocks.

In an example, a memory block includes multiple word-lines (WLs) in which data is stored as multiple pages. For example, a memory block including multi-level cell (MLC) WLs may be referenced herein as an MLC memory block, a memory block including triple-level cell (TLC) WLs may be referenced herein as a TLC memory block, a memory block including quad-level cell (QLC) WLs may be referenced herein as a QLC memory block, and so on. An MLC WL stores two-pages of data per bit-cell. A TLC WL stores three-pages of data per bit-cell, and a QLC WL stores four-pages of data per bit-cell. During a memory compaction process, data read from a MLC WL may be written in another MLC WL. Similarly, during the memory compaction process, data read from a TLC WL or a QLC WL may be written in another TLC WL or QLC WL, respectively.

Accordingly, various examples described herein can be applied to a MLC memory block, a TLC memory block, a QLC memory block, and so on. Accordingly, a MLC memory block, a TLC memory block, and/or a QLC memory block may be referred to as a memory block. Likewise, a WL may be referred to as a memory location.

Additionally, the memory compaction process described herein utilizes or implements concepts of a folding memory architecture scheme and/or a shifted dual write architecture scheme. These architecture schemes, along with the memory compaction process, are discussed in greater detail herein.

Current memory compaction processes include reading data from multiple pages stored in a WL or a memory location of a source memory block. After reading data of a page, a determination is made as to whether a read error has occurred. If it is determined that a read error did occur, the error is corrected by performing a read error handling operation. The corrected data is then temporarily written in a WL or a memory location of a destination memory block.

Reading data corresponding to one page, and then performing a read error handling operation on that page, typically does not leave sufficient time to read another page from the source memory block during the same phase or cycle. Accordingly, data of the page is typically stored in a WL or a memory location (e.g., a first WL or a first memory location) of the destination memory block. Since the WL or the memory location of the destination memory block generally stores multiple pages per bit-cell, and data corresponding to only one page is available for writing, padding data, corresponding to other pages, is added (or written) to the first memory location of the destination memory block.

During a second reading phase, a second page from the source memory block is read. If a read operation error is not detected, data of the second page (e.g., the data that was read from the source memory block during the second reading phase), and data associated with the first page that written in the first memory location of the destination memory block (excluding the padded data), is written to another memory location (e.g., a second memory location) of the destination memory block.

However, if a read error has been detected during the second reading phase, a read error handling operation is performed on the data associated with the second page to generate corrected data. The corrected data, and the data that was written in the first memory location of the destination memory block (excluding padding data), is then written to the second memory location of the destination memory block. Padding data is also added to represent any remaining pages for which data is not yet available for writing. The second memory location of the destination memory block is different from the first memory location of the destination memory block.

During a third reading phase, the last page of the source memory block is read. If it is determined that read operation error has not occurred, data associated with the last page, and data written in the second memory location of the destination memory block during the previous phase, are written to another memory location (e.g., a third memory location) of the destination memory block.

The third memory location of the destination memory block thus includes data corresponding to all pages of the source memory location. The third memory location may be referred to herein as a destination memory location of the destination memory block. Accordingly, during the currently known memory compaction process, for a TLC memory block, at least two WLs, or two memory locations, of the destination memory block are wasted. This substantial overhead required for reading and writing data multiple times makes the memory compaction process inefficient.

In order to address the above, the memory compaction process described herein utilizes a folding memory architecture scheme and/or a shifted dual write architecture scheme to improve performance and reduce overhead, especially when compared with current solutions. In a folding memory architecture scheme, data is written in a temporary or intermediate memory block prior to being written to a destination memory block. In an example, the temporary or intermediate memory block may be a single-level cell (SLC) memory block including SLC WLs (or memory locations). Additionally, the destination memory block may be a MLC memory block, a TLC memory block, a QLC memory block, and so on.

In examples, a SLC WL (or a SLC memory location) stores data in a single page per bit-cell. Accordingly, once data is written in at least two memory locations of the SLC memory block, data from two memory locations of the SLC memory block may be written in a memory location of the MLC memory block. In another example, once data is written in at least three memory locations of the SLC memory block, the data from three memory locations of the SLC memory block may be written in a memory location of a TLC memory block. An architecture in which data is written from memory locations of the SLC memory block to a memory location of a destination memory block, such as an MLC memory block, a TLC memory block, and/or a QLC memory block, may be referred to herein as a folding memory architecture.

The shifted dual write architecture helps implement data redundancy. For example, data is written as pages in a memory block. However, for redundancy purposes, the same data may be written in at least two memory blocks. Each of the two memory blocks to which the data is written is generally on different, but neighboring, planes. Accordingly, in some examples, data is being written to a first memory location of a first memory block (or a primary memory block) in a first plane, and is also written to a first memory location of a second memory block (or a secondary memory block) in a second plane.

However, signal interference during data writes to the first memory block and the second memory block may cause data of one of the memory locations of the primary memory block or the secondary memory block to be corrupted. To avoid this, data is not written in the top eight memory locations of the primary memory block in the first plane. Instead, the data is written in the primary memory block beginning with the ninth WL. Accordingly, the top eight memory locations of the primary memory block remain unused.

In an example, the bottom eight memory locations of the secondary memory block also remain unused for similar reasons. Alternatively, the top eight memory locations of the secondary memory block and the bottom eight memory locations of the primary memory block may remain unused. Although eight memory locations are specifically mentioned, any number of memory locations may remain unused.

In the memory compaction process described herein, data corresponding to a page read during a first phase from the source memory block is written to one of the top eight or bottom eight SLC memory locations of the primary memory block or secondary memory block. As previously explained, the top eight or bottom eight SLC memory locations of the primary memory block or the secondary memory block generally remain unused in the shifted dual write architecture. If a read operation error has occurred while reading data from the source memory block, a read error handling operation is performed to generate corrected data. The corrected data is then written in one of the top eight or bottom eight SLC memory locations of the primary memory block or the secondary memory block. Otherwise, correct data corresponding to the page read is written in one of the top eight or bottom eight SLC memory locations of the primary memory block or the secondary memory block.

During a second reading phase (or other subsequent phases), data corresponding to another page of the source memory block is read. A read error handling operation is then performed (if required). Data that is read during the second phase is written in another SLC memory location of the top eight or bottom eight SLC memory locations of the primary memory block or the secondary memory block. This process may repeat any number of times depending on the type of memory block from which data is being read and/or based on one or more timeout conditions associated with the data storage device.

During a third reading phase, data corresponding to a third page of the source memory block is read. A read error handling operation may then be performed (if required). Data that is read and/or corrected during the third phase, and data written to the two SLC memory locations of the top eight or the bottom eight SLC memory locations of the primary memory block or the secondary memory block is written (folded) in a memory location of the destination memory block.

In the present example, the source memory block the destination memory block may be TLC memory blocks. Accordingly, two SLC memory locations of the top eight or the bottom eight SLC memory locations of the primary memory block or the secondary memory block are used during the memory compaction process. For a source memory block and a destination memory block of other types, a different number of SLC memory locations of the primary memory block or secondary memory block may be used.

Since the SLC memory locations used during the memory compaction process are generally unused SLC memory locations, resources of memory blocks are not wasted. Further, padding data is not used or written during the memory compaction process. As such, overhead associated with the currently known mechanisms of a memory compaction process is substantially eliminated or reduced.

These and other examples are described in more detail with respect to FIG. 1-FIG. 7.

FIG. 1 is a block diagram of a system 100 that includes a host device 105 and a data storage device 110 according to an example. In an example, the host device 105 includes a processor 115 and a memory 120 (e.g., main memory). The memory 120 may include or otherwise be associated with an operating system 125, a kernel 130 and/or an application 135.

The processor 115 can execute various instructions, such as, for example, instructions from the operating system 125 and/or the application 135. The processor 115 may include circuitry such as a microcontroller, a Digital Signal Processor (DSP), an Application-Specific Integrated Circuit (ASIC), a Field Programmable Gate Array (FPGA), hard-wired logic, analog circuitry and/or various combinations thereof. In an example, the processor 115 may include a System on a Chip (SoC).

In an example, the memory 120 can be used by the host device 105 to store data used, or otherwise executed by, the processor 115. Data stored in the memory 120 may include instructions provided by the data storage device 110 via a communication interface 140. By way of an example, the data storage device 110 may be a data storage device internal to the host device 105 or a data storage device external to the host device 105. The data stored in the memory 120 may also include data used to execute instructions from the operating system 125 and/or one or more applications 135. The data stored in the memory 120 may be static and/or dynamic data associated with the operating system 125 and/or the one or more applications 135. The memory 120 may be a single memory or may include multiple memories, such as, for example one or more non-volatile memories, one or more volatile memories, or a combination thereof.

In an example, the operating system 125 may create a virtual address space for the application 135 and/or other processes executed by the processor 115. The virtual address space may map to locations in the memory 120. The operating system 125 may also include or otherwise be associated with a kernel 130. The kernel 130 may include instructions for managing various resources of the host device 105 (e.g., memory allocation), handling read and write requests, handling a garbage collection process, handling a memory compaction process, and so on.

The communication interface 140 communicatively couples the host device 105 and the data storage device 110. The communication interface 140 may be a Serial Advanced Technology Attachment (SATA), a PCI express (PCIe) bus, a Small Computer System Interface (SCSI), a Serial Attached SCSI (SAS), Ethernet, Fiber Channel, or Wi-Fi. As such, the host device 105 and the data storage device 110 need not be physically co-located and may communicate over a network such as a Local Area Network (LAN) or a Wide Area Network (WAN), such as the internet. In addition, the host device 105 may interface with the data storage device 110 using a logical interface specification such as Non-Volatile Memory express (NVMe) or Advanced Host Controller Interface (AHCI).

The data storage device 110 may include a controller 150 and a memory device 155. In an example, the controller 150 is communicatively coupled to the memory device 155. In some examples, the memory device 155 includes one or more memory dies (e.g., first memory die 165 and second memory die 170). Although memory dies are specifically mentioned, the memory device 155 may include any non-volatile memory device, storage device, storage elements or storage medium including NAND flash memory cells and/or NOR flash memory cells.

The memory cells can take the form of solid-state (e.g., flash) memory cells and can be one-time programmable, few-time programmable, or many-time programmable. Additionally, the memory cells may be single-level cells (SLCs), multi-level cells (MLCs), triple-level cells (TLCs), quad-level cells (QLCs), penta-level cells (PLCs), and/or use any other memory technologies. The memory cells may be arranged in a two-dimensional configuration or a three-dimensional configuration.

In some examples, the data storage device 110 may be attached to or embedded within the host device 105. In another example, the data storage device 110 may be implemented as an external device or a portable device that can be communicatively or selectively coupled to the host device 105. In yet another example, the data storage device 110 may be a component (e.g., a solid-state drive (SSD)) of a network accessible data storage system, a network-attached storage system, a cloud data storage system, and the like.

As indicated above, the memory device 155 of the data storage device 110 may include a first memory die 165 and a second memory die 170. Although two memory dies are shown, the memory device 155 may include any number of memory dies (e.g., one memory die, two memory dies, eight memory dies, or another number of memory dies).

The memory device 155 may also include support circuitry. In an example, the support circuitry includes read/write circuitry 160. The read/write circuitry 160 supports the operation of the memory dies of the memory device 155. Although the read/write circuitry 160 is depicted as a single component, the read/write circuitry 160 may be divided into separate components, such as, for example, read circuitry and write circuitry. The read/write circuitry 160 may be external to the memory dies of the memory device 155. In another example, one or more of the memory dies may include corresponding read/write circuitry 160 that is operable to read data from and/or write data to storage elements within one individual memory die independent of other read and/or write operations on any of the other memory dies.

In an example, one or more of the first memory die 165 and the second memory die 170 include one or more memory blocks. In an example, each memory block includes one or more memory cells. A block of memory cells is the smallest number of memory cells that are physically erasable together. In an example and for increased parallelism, each of the blocks may be operated or organized in larger blocks or metablocks. For example, one block from different planes of memory cells may be logically linked together to form a metablock. Alternatively, or additionally, one memory block from each of the two different planes can be used to store data in a redundant mode, as described herein, according to a shifted dual write architecture. Since details of the shifted dual write architecture are described with sufficient details above, those details are not repeated here again for brevity.

Figure 2A:
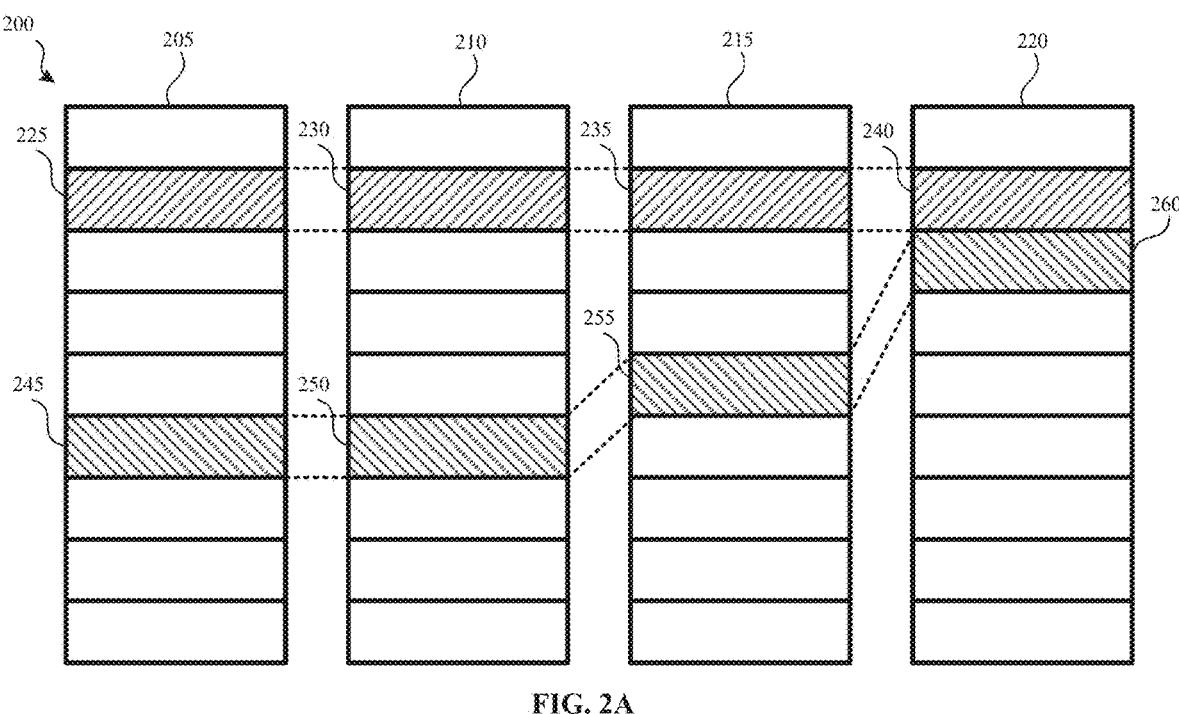
FIG. 2A illustrates how a memory die may include a number of memory blocks according to an example.

For example, and referring to FIG. 2A, a memory device 200 (e.g., a storage element, a memory die, a non-volatile memory device) may include four planes or sub-arrays (e.g., a first plane 205, a second plane 210, a third plane 215, and a fourth plane 220). In some examples, the planes may be integrated on a single memory die, be provided on two different memory dies (e.g., two planes on each memory die) or on four separate memory dies. Although four planes are shown and described, the memory device 200 may have any number of planes and/or memory dies.

In some examples, the planes are divided into memory blocks including memory cells. As shown in FIG. 2A, the rectangles represent each memory block, such as memory block 225, memory block 230, memory block 235 and memory block 240. There may be dozens or hundreds of memory blocks in each plane of the memory device 200. In an example, each memory block is a unit of erase and is referred to as an erase block. For example, memory block 225, memory block 230, memory block 235 and memory block 240 include a particular number of memory cells that may be erased together.

In addition, various memory blocks may be logically linked or grouped together (e.g., using a table in or otherwise accessible by the controller 150) to form a metablock. A metablock may be written to, read from and/or erased as a single unit. For example, memory block 225, memory block 230, memory block 235 and memory block 240 may form a first metablock while memory block 245, memory block 250, memory block 255 and memory block 260 may form a second metablock. The memory blocks used to form a metablock need not be restricted to the same relative locations within their respective planes.

Figure 2B:
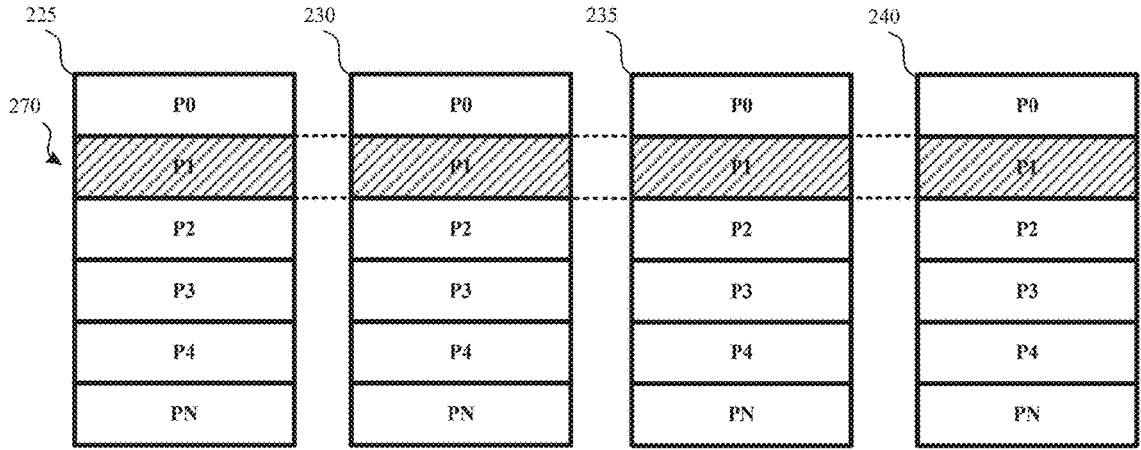
FIG. 2B illustrates how a memory block may include one or more pages according to an example.

In an example, each memory block may be divided, for operational purposes, into pages of memory cells, such as illustrated in FIG. 2B. For example, the memory cells of memory block 225, memory block 230, memory block 235 and memory block 240 are divided into N different pages (shown as P0-PN). Although a specific number of pages are shown in FIG. 2B, a memory block may have any number of pages stored in memory cells within each memory block.

In an example, a page is a unit of data programming within the memory block. Each page includes the minimum amount of data that can be programmed at one time. The minimum unit of data that can be read at one time may be less than a page. A metapage 270 is illustrated in FIG. 2B as being formed of one physical page from memory block 225, memory block 230, memory block 235 and memory block 240. In the example, shown, the metapage 270 includes page P1 in each of the four memory blocks. However, the pages of the metapage 270 need not have the same relative position within each of the memory blocks. A metapage 270 may be the maximum unit of programming within a memory block.

The memory blocks disclosed in FIG. 2A-FIG. 2B are referred to herein as physical memory blocks because they relate to groups of physical memory cells as discussed above. As used herein, a logical memory block is a virtual unit of address space defined to have the same size as a physical memory block. Each logical memory block includes a range of logical memory block addresses (LBAs) that are associated with data received from a host. The LBAs are then mapped to one or more physical memory blocks in the data storage device 110 where the data is physically stored.

Figure 2C:
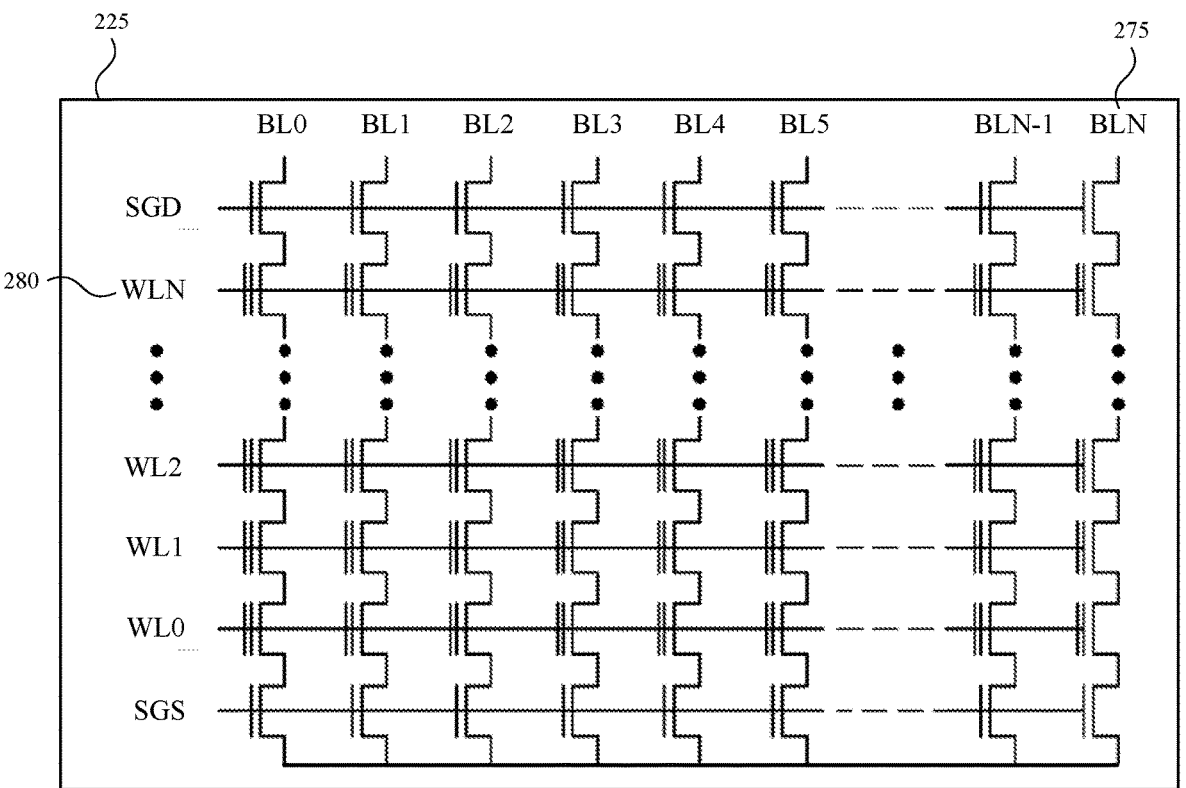
FIG. 2C illustrates how a memory block may include a number of memory cells according to an example.

As indicated above, each memory block may include any number of memory cells. The design, size, and organization of a memory block may depend on the architecture, design, and application desired for each memory die. In an example, the memory block may be or include a contiguous set of memory cells that share a plurality of wordlines and bit lines. For example, and as shown in FIG. 2C, the memory block 225 includes bit lines BL0-BLN (collectively bit lines 275), where N is a total number of bit lines. Additionally, the memory block 225 includes wordlines WL0-WLN (collectively wordlines 280), where N is a total number of wordlines.

A wordline 280 may function as a SLC WL, an MLC WL, a TLC WL, a QLC WL, a penta-level cell (PLC) WL, and so on. Additionally, each memory cell may be programmable to a state (e.g., a threshold voltage in a flash configuration or a resistive state in a resistive memory configuration) that indicates one or more values. Each memory cell (also referred herein as a bit-cell) may store a different number of pages. For example, a bit-cell of the MLC WL stores two pages, a bit-cell of the TLC WL stores three pages, a bit-cell of the QLC WL stores four pages, and a bit-cell of the PLC WL stores five pages, and so on. A bit-cell of the SLC WL stores a single page.

In the example shown in FIG. 2C, four memory cells are connected in series to form a NAND string. Although four memory cells are depicted, any number of memory cells (e.g., 16, 32, 64, 128, 256 or any other number or memory cells) may be used. One terminal of the NAND string is connected to a corresponding bit line via a drain select gate (connected to select gate drain line SGD) and another terminal of the NAND string is connected to a source line via a source select gate (connected to select gate source line SGS). Additionally, although eight bit lines are shown in FIG. 2C, any number of bit lines may be used.

In an example, a wordline 280 may include one or more portions, segments, or sections. For example, a wordline 280 may include a first section and a second section. Additionally, each section of the wordline 280 may store data. The stored data may be a codeword that includes a data portion and a parity portion.

During a memory compaction process, data stored in a page of a memory block 225 (e.g., a source memory block) is read and written (moved) to a different location (e.g., another WL or another memory location) of the same memory block (e.g., memory block 225) or a different memory block (e.g., memory block 230). The memory compaction process as described herein according to concepts of the folding memory architecture and the shifted dual write architecture is discussed using FIG. 2B and FIG. 2C.

In one example, the processor 115 may trigger a GC process. During the GC process, the controller 150 may initiate a memory compaction process by providing instructions to a memory compaction system 180. The memory compaction system 180 may determine that data stored as pages in the memory block 225 is to be moved to memory block 240. As such, the memory block 225 becomes a source memory block and the memory block 240 becomes a destination memory block.

In the examples that follow, the source memory block 225 is a TLC memory block and the destination memory block 240 is also a TLC memory block. Additionally, in the examples that follow, memory block 230 and memory block 235 may be the primary SLC memory block and the secondary SLC memory block utilized by the shifted dual write architecture scheme previously described. Accordingly, the top eight WLs of the memory block 230 and the bottom eight WLs of the memory block 235 are generally unused or reserved WLs.

In an example, pages in the source memory block 225 are stored as a lower page (LP), a middle page (MP), and an upper page (UP) in each memory cell. One, some, or all of the pages may be read independently or at the same time. In another example, one, some or all of the pages may be read in cycles (e.g., depending on a timeout condition associated with the data storage device 110). For example and depending on a timeout condition implemented or enforced by the data storage device 110, each of the LP, MP, and UP may be read during a different reading phase (or cycle) because not enough time is available to read multiple pages and/or correct any errors during a single reading phase.

In current implementations, each of the LP, MP, and UP is read during a different reading phase. Any read operation errors that are detected are cured by performing a read error handling operation during each reading phase. For example, during the first reading phase, data corresponding to the LP at a first memory location in the source memory block is written to a first memory location in the destination memory block. Since data corresponding to the MP and UP is not yet available during the first reading phase, padding data is added in the destination memory block in lieu of the data corresponding to the MP and UP.

During the second reading phase, data corresponding to the MP at the first memory location in the source memory block and data corresponding to the LP at the first memory location in the destination memory block is written to a second memory location in the destination memory block. Since data corresponding to the UP is not yet available during the second reading phase, padding data is added to the destination memory block in lieu of the data corresponding to the UP.

During the third reading phase, data corresponding to the UP at the first memory location in the source memory block and data corresponding to the LP and MP at the second memory location in the destination memory block is written to a third memory location in the destination memory block. Accordingly, memory resources associated with the first memory location and the second memory location of the destination memory block, which are used to store data temporarily, are wasted during the currently known memory compaction process.

In contrast, the memory compaction process described herein is based on concepts of a folding memory architecture and a shifted dual write architecture. As such, utilization of memory resources in the destination memory block is significantly reduced during the memory compaction process. For purposes of explanation, the same situation described above will now be explained using the memory compaction process described herein.

In an example, pages in the source memory block 225 are stored as LP, MP, and UP. Further, each of the LP, MP, and UP is read in a different reading phase. Any read operation error that occurs while reading each of the LP, MP, and the UP is cured by performing a read error handling operation during each reading phase.

During the first reading phase, data corresponding to the LP at a first memory location in the source memory block is written to a first memory location in the primary SLC memory block or the secondary SLC memory block. The first memory location is one of the top eight (or any other number of) SLC memory locations of the primary SLC memory block, or the bottom eight (or the any other number of) SLC memory locations of the secondary SLC memory block, or vice versa. Even though data corresponding to the MP and UP is not yet available during the first reading phase, a padding operation (in which padding data is added to the LP) is not required since the data is written in a SLC memory block.

During the second reading phase, data corresponding to the MP at the first memory location in the source memory block is written to a second memory location in the primary SLC memory block or the secondary SLC memory block. The second memory location in the primary SLC memory block or the secondary SLC memory block is one of the top eight (or the any other number of) SLC memory locations of the primary SLC memory block, or the bottom eight (or the any other number of) SLC memory locations of the secondary SLC memory block, or vice versa. The second memory location in the primary SLC memory block or the secondary SLC memory block is different from the first memory location in the primary SLC memory block or the secondary SLC memory block. Even though data corresponding to the UP is not available during the second reading phase, a padding operation is not required since the data is written in a SLC memory block.

During the third reading phase, data corresponding to the UP at the first memory location in the source memory block, and data corresponding to the LP and MP at the first memory location and second memory location respectively, in the primary SLC memory block or the secondary SLC memory block is written to a first memory location in the destination memory block. During the third reading phase, the data of the UP is not written to the primary SLC memory block or the secondary SLC memory block. The data of the UP is directly written to the first memory location in the destination memory block because data from a sufficient number of pages is available to write in the first memory location in the destination memory block. Accordingly, memory locations in the destination memory block are not wasted during the memory compaction process when compared with the current implementation.

Referring back to FIG. 1, as previously described, the data storage device 110 may also include a controller 150. The controller 150 may be communicatively coupled to the memory device 155 via a bus, an interface or other communication circuitry. In an example, the communication circuitry may include one or more channels to enable the controller 150 to communicate with the first memory die 165 and/or the second memory die 170 of the memory device 155. In another example, the communication circuitry may include multiple distinct channels which enables the controller 150 to communicate with the first memory die 165 independently and/or in parallel with the second memory die 170 of the memory device 155.

The controller 150 may receive data and/or instructions from the host device 105. The controller 150 may also send data to the host device 105. For example, the controller 150 may send data to and/or receive data from the host device 105 via the communication interface 140. The controller 150 may also send data and/or commands to and/or receive data from the memory device 155.

The controller 150 may send data and a corresponding write command to the memory device 155 to cause the memory device 155 to store data at a specified address of the memory device 155. In an example, the write command specifies a physical address of a portion of the memory device 155. In other words, the physical address may specify a particular memory block and/or a particular WL at which the data moved from another physical address of another portion of the memory device 155 to be written during a memory compaction process.

The controller 150 may also send data and/or commands associated with one or more background scanning operations, garbage collection operations, and/or wear leveling operations. The controller 150 may also send one or more read commands to the memory device 155. In an example, the read command specifies the physical address of a portion of the memory device 155 at which the data is stored. The controller 150 may also track the number of program/erase cycles or other programming operations that have been performed on or by the memory device and/or the memory dies of the memory device 155.

As previously discussed, the controller 150 may include or otherwise be associated with a memory compaction system 180. The memory compaction system 180 may be a packaged functional hardware unit designed for use with other components/systems, a portion of a program code (e.g., software or firmware) executable by a processor or processing circuitry, or a self-contained hardware and/or software component that interfaces with other components and/or systems.

In an example, the memory compaction system 180 may include information or otherwise provide instructions regarding whether data of a particular wordline or a location of a memory block of a memory die is to be moved to another wordline or location of the same or different memory block of the same or different memory die.

The memory compaction system 180 may perform read error handling operation using an error correction (ECC) system 185. The ECC system 185 may use an error correction code in accordance with a particular read operation error. For example, the ECC system 185 may correct read disturb error using LDPC error correction codes/operations. Similarly other types of error correction codes may be used to correct other types of read operation error.

The memory compaction system 180 may then fetch corrected data from the SLC memory block(s), (corrected) data from a memory location in the source memory block, and data corresponding to other remaining pages of the memory location from the source memory block (e.g., a TLC memory block) and cause the data to be written to a particular memory location in a destination memory block. The destination memory block may be the same memory block as the source memory block or a different memory block. The source memory block and the destination memory block may be on the same plane of a memory die, different planes of a memory die and/or on the same memory die or on different memory dies.

The currently known memory compaction process is described below with respect to FIG. 3. The improved memory compaction process implemented with the concepts of folding a memory architecture and a shifted dual write architecture, is described below with respect to FIG. 4A-FIG. 4B. Further, in the examples that follow, a memory block on which the memory compaction process is performed is a TLC memory block. Accordingly, in the examples that follow, the source and the destination memory blocks are TLC memory blocks.

Figure 3:
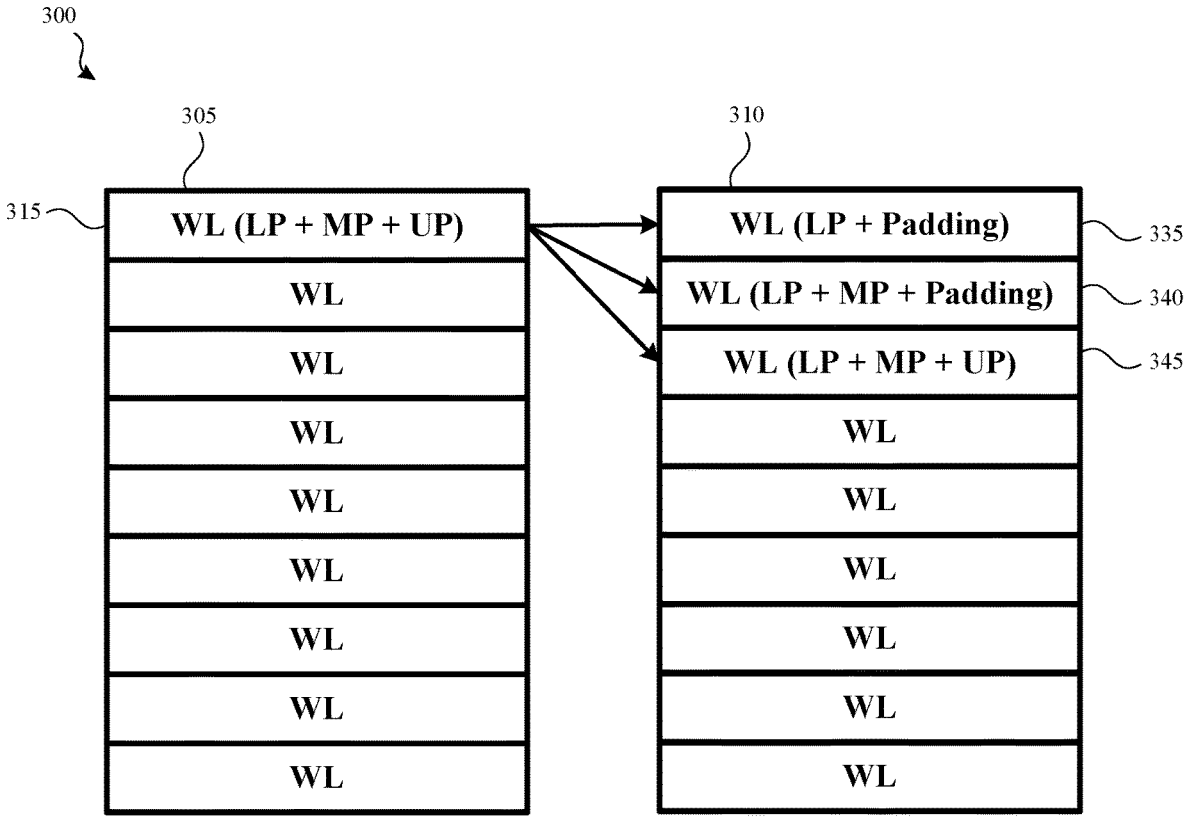
FIG. 3 illustrates a memory compaction process for a triple-level cell (TLC) memory block.

FIG. 3 illustrates a memory compaction process 300 for a triple-level cell (TLC) memory block. The TLC memory block is referred to as a source memory block 305. The source memory block 305 may include multiple WLs or memory locations. During the memory compaction process, a controller may cause data written in a WL (or a memory location) 315 to be moved to a WL (or a memory location) of a destination memory block 310. As described herein, the memory location 315 of the source memory block may include three pages (a LP, a MP, and an UP) for each bit-cell, and each page is read during a different reading phase.

During a first reading phase, the LP of the memory location 315 is read. If a read operation error occurred corresponding to the LP of the memory location 315, a read error handling operation is performed. Upon completion of a successful read error handling operation corresponding to the LP of the memory location 315, data of the LP of the memory location 315 is written, along with padding data, to a WL or a memory location 335 of the destination memory block 310. If a read operation error did not occur while reading the LP from the memory location 315, the data of the LP of the memory location 315 is written, along with padding data, to the memory location 335 of the destination memory block 310.

During a second reading phase, a MP of the memory location 315 is read. If a read operation error did not occur while reading data of the MP, the data of the MP, and data written in the memory location 335, along with the padding data, is written to a WL or a memory location 340 of the destination memory block 310. If a read operation error did occur, a read error correction operation is performed on the data of the MP. Additionally, the data of the MP, and data written in the memory location 335, along with padding data, is written in the memory location 340 of the destination memory block 310.

During a third reading phase, an UP of the memory location 315 is read. If a read operation error did not occur while reading data of the UP, the data of the UP, and data written in the memory location 340 (without padding data), is written to a WL or a memory location 345 of the destination memory block 310.

Accordingly, the memory locations 335 and 340 of the destination memory block 310 are wasted during the currently known memory compaction process. An improved memory compaction process, based on the concepts of a folding memory architecture and a shifted dual write architecture, will now be described with respect to FIG. 4A and FIG. 4B. As will be described, the memory compaction process described herein does not waste any WLs or memory locations in a destination memory block.

Figure 4A:
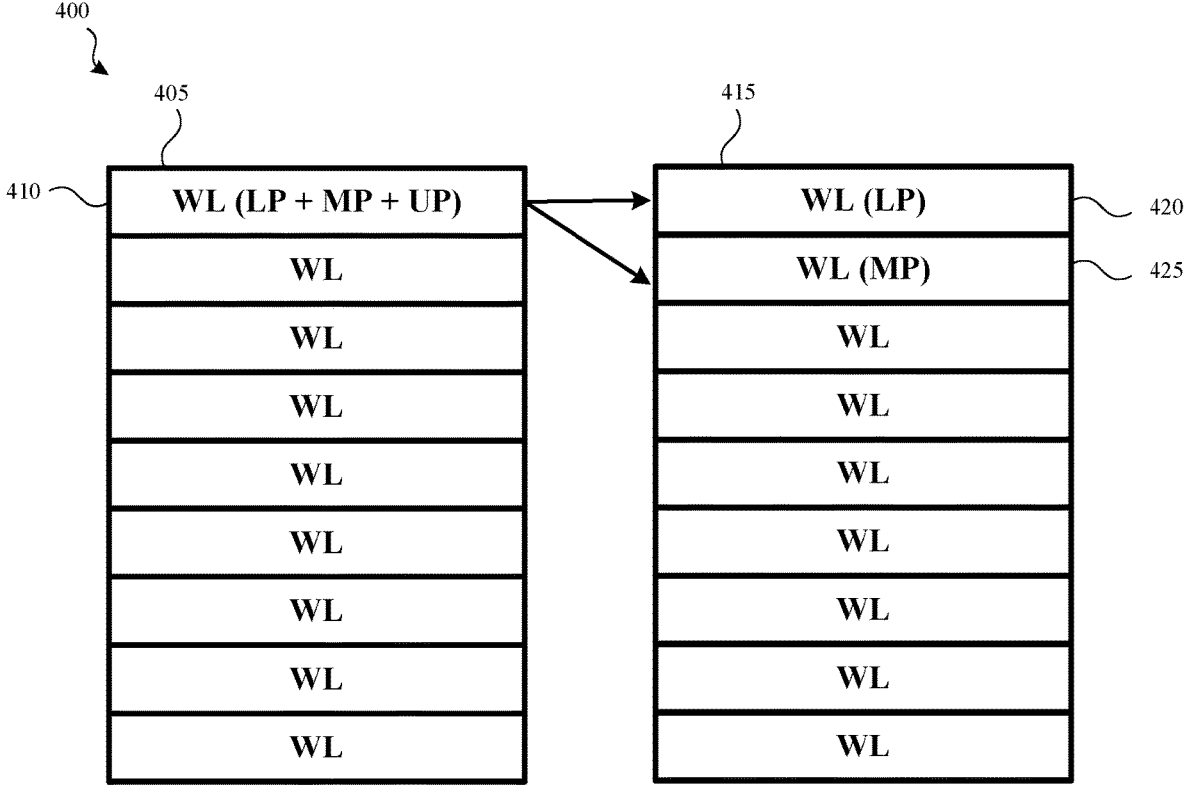
FIG. 4A illustrates a memory compaction process according to an example.

FIG. 4A illustrates a memory compaction process 400 according to an example. In an example, the memory compaction process 400 may be performed by a controller and/or a memory compaction system, for example, the controller 150 and the memory compaction system 180 shown and described with respect to FIG. 1.

In the example shown in FIG. 4A, during the memory compaction process 400, a controller may instruct a memory compaction system to move data written in a memory location 410 of a source memory block 405 to a memory location of a destination memory block (e.g., destination memory block 430 (FIG. 4B)). In this example, each of the source memory block 405 and the destination memory block 430 are TLC memory blocks. However, the same processes may be performed for different types of memory blocks.

During a first reading phase, a LP of the memory location 410 of the source memory block 405 is read. If a read operation error occurred or is otherwise detected, a read error handling operation is performed on the data to generate corrected data.

Upon successful completion of the read error handling operation, the corrected data of the LP of the memory location 410 of the source memory block 405 is written to a WL or a memory location 420 of an intermediate memory block 415. In an example, the intermediate memory block 415 is a SLC memory block. If a read operation error did not occur or was otherwise not detected, the data of the LP of the memory location 410 is written to the memory location 420 of the intermediate memory block 415.

In an example, the intermediate memory block 415 may be one of a primary intermediate memory block (e.g., a primary SLC memory block) or a secondary intermediate memory block (e.g., a secondary SLC memory block). As such, the memory location 420 may be one of the top eight (or any number of) memory locations of the primary intermediate memory block, or the bottom eight (or the any number of) memory locations of the secondary intermediate memory block, or vice versa—which, in a shifted dual write architecture, are generally unused/reserved memory locations such as previously described.

During a second reading phase, a MP of the memory location 410 in the source memory block 405 is read. If a read operation error did not occur or was otherwise not detected while reading data of the MP, the data of the MP is written to a WL or a memory location 425 of the intermediate memory block 415. Otherwise, the data of the MP is written to the memory location 425 of the intermediate memory block 415 after a successful read error handling operation has been performed on the data of the MP.

Figure 4B:
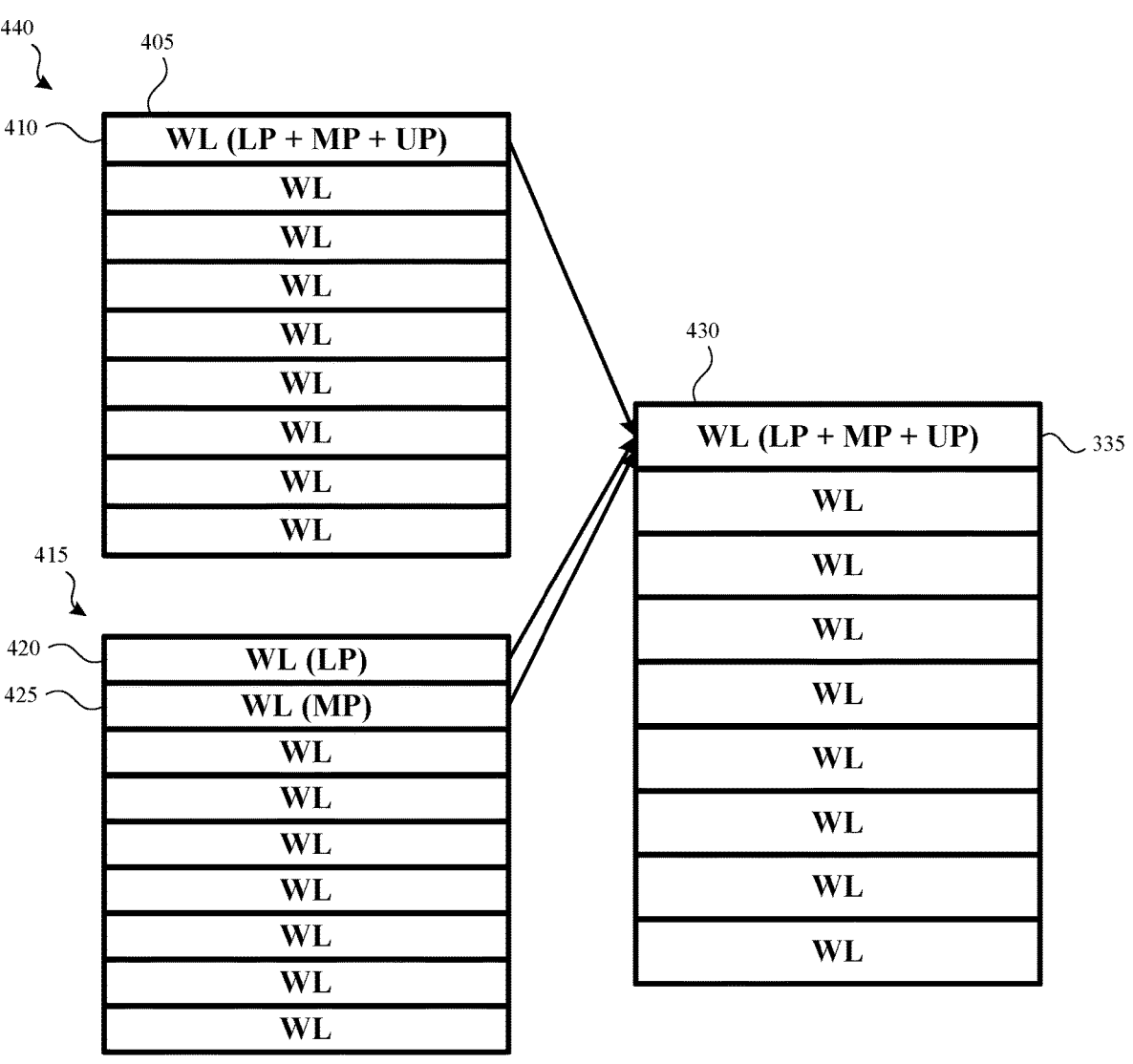
FIG. 4B illustrates a continuation of the memory compaction process shown and described with respect to FIG. 4A according to an example.

FIG. 4B illustrates a continuation 440 of the memory compaction process 400 shown and described with respect to FIG. 4A according to an example. In the example shown in FIG. 4B, a third reading phase is occurring. Although three different reading phases are shown and described with respect to FIG. 4A-FIG. 4B, the memory compaction processes 400 and 440 may occur in any number of different phases. In an example, the number of phases may be based, at least in part, on timeout conditions associated with a data storage device, garbage collection operations, an amount of idle time of the data storage device or host device and the like.

Continuing with the example, during the third reading phase, an UP of the memory location 410 of the source memory block 405 is read. If a read operation error did not occur or was otherwise not detected while reading the data of the UP, the data of the UP, and data written in memory location 420 and memory location 425 in the intermediate memory block 415, are written to a memory location 435 (e.g., one or more WLs) of a destination memory block 430.

As described herein, the memory compaction process shown with respect to FIG. 4A-FIG. 4B results in an improved memory compaction process by reducing overhead associated with writing padding data and using only a single WL or a memory location of the destination memory block during the memory compaction process.

FIG. 5 illustrates a method 500 for performing a memory compaction process for a memory block of a memory die according to an example. The method 500 may be performed on a data storage device and/or one or more storage elements of a data storage device, such as, for example, the data storage device 110 shown and described with respect to FIG. 1. Additionally, the various operations shown and described with respect to FIG. 5 may be performed by a controller and/or a memory compaction system, such as, for example, the controller 150 and the memory compaction system 180 shown and described with respect to FIG. 1.

Method 500 begins when a read operation is performed (505) on one or more pages of a source memory block. The source memory block may be a MLC memory block, a TLC memory block, a QLC memory block, a PLC memory block, and so on such as previously described. In an example, and depending on one or more factors associated with the data storage device (e.g., timeout condition factors) the read operation on the one or more pages may be performed in one reading phase (or cycle) or multiple reading phases (or cycles). In the non-limiting examples that follow, each page of the one or more pages are read during different reading phases or cycles.

When the one or more pages are read, a determination (510) is made as to whether a read operation error has occurred with respect to a first page (or at least a first page) of the one or more pages. Based on determining (510) that a read operation error (or some other error) has occurred, an error correction operation may be performed (515) on the first page to generate corrected data. Based on successful error correction operation being performed, the corrected data associated with the first page is stored (520) in a reserved memory location of an intermediate memory block.

In an example, the intermediate memory block may store data in a single page at a respective memory location. For example, the intermediate memory block may be a SLC memory block. As such, the intermediate memory block may be configured to store data associated with one or more pages while data associated with one or more additional pages is available and/or waiting to be written to a destination memory block. In an example, the reserved memory location of the intermediate memory block may be a subset of memory locations of a set of memory locations in the intermediate memory block, where each memory location of the set of memory locations may store data in a single page.

In another example, the intermediate memory block may be a set of memory blocks. The set of memory blocks may include a primary memory block and a secondary memory block. The primary memory block and the secondary memory block may each be a SLC memory block. The reserved memory location in the intermediate memory block may be a memory location selected from a first subset of memory locations of a first set of memory locations in the primary memory block or a second subset of memory location of a second set of memory locations in the secondary memory block.

For example, the first subset of memory locations may include the top eight (or any number of) memory locations of the first set of memory locations. Likewise, the second subset of memory locations may include the bottom eight (or any number of) memory locations of the second set of memory locations. In another example, the first subset of memory locations may include the bottom eight (or any number of) memory locations of the first set of memory locations and the second subset of memory locations may include the top eight (or any number of) memory locations of the second set of memory locations.

Accordingly, a total number of memory locations in the first subset of memory locations and a total number of memory locations in the second subset of memory locations may be the same. In another example, the total number of memory locations in the first subset of memory locations and the total number of memory locations in the second subset of memory locations may be different.

However, if it is determined (510) that a read error operation has not occurred with respect to the first page (or at least the first page) of the one or more pages, the data associated with the first page is stored (525) in a reserved memory location of the intermediate memory block. This process may be similar to the process previously described with respect to operation 520.

When data (either the corrected data or the "original" data) has been stored in the reserved memory location in the intermediate memory block, a second page (or the next page or pages) may be retrieved (530) from the source memory block. A determination (535) may then be made as to whether the second page (or the next page or pages) are the last pages in that particular memory location of the source memory block. If it is determined (535) that the second page (or the next page or pages) are not the last pages in the particular memory location of the source memory block, a read operation is performed (505) on the second page and the method 500 may repeat.

However, if it is determined (535) that the second page (or the next page or pages) is the last page in the particular memory location of the source memory block, data associated with the second page, along with data in the intermediate memory block, is provided and written (540) to a memory location in a destination memory block. In an example, error correction operations may be performed, as needed, on the second page prior to writing the data associated with the second page, and the data in the intermediate memory block, to the destination memory block.

Figures 6, 7:
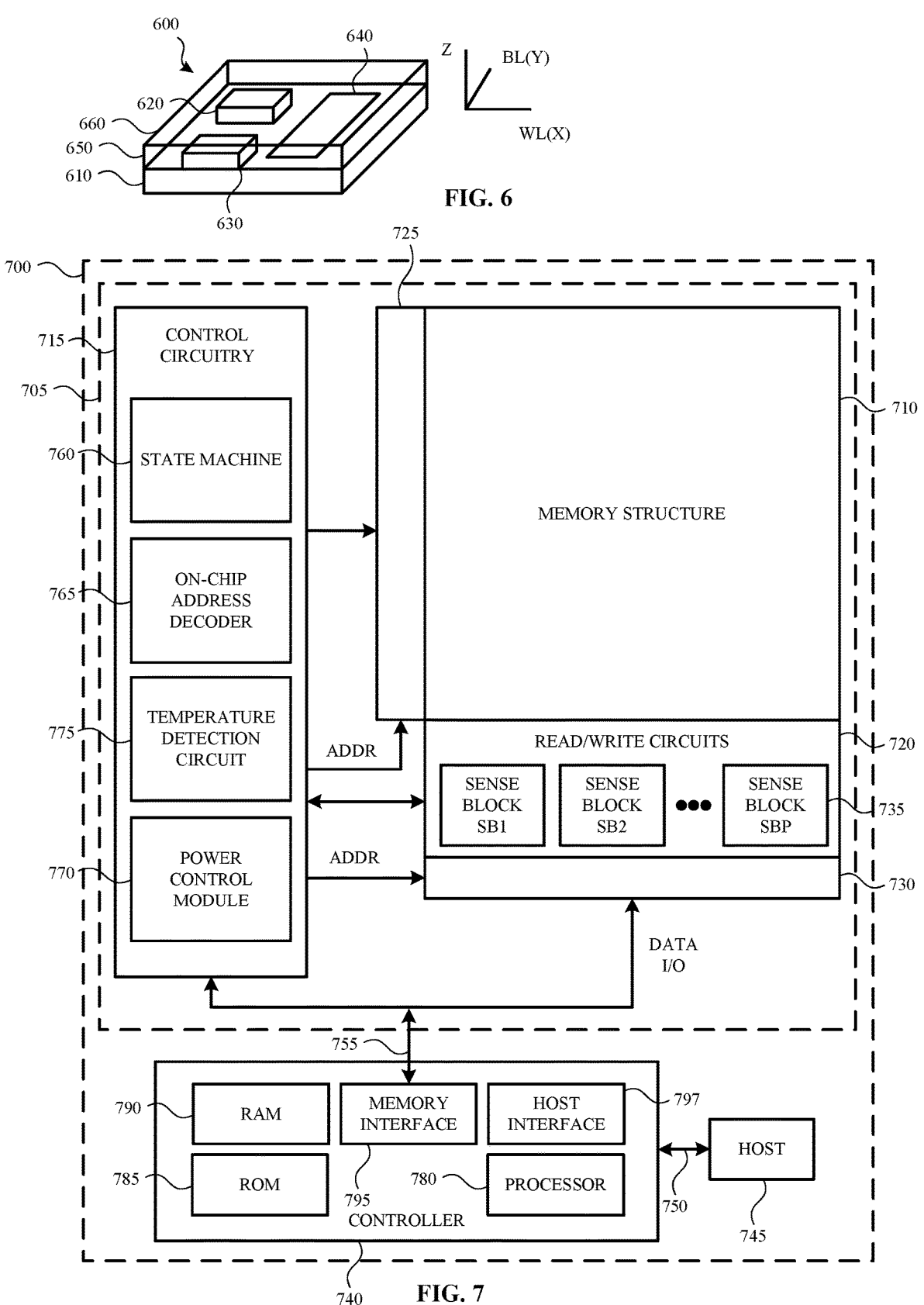
FIG. 6 is a perspective view of a storage device that includes three-dimensional (3D) stacked non-volatile memory according to an example.
FIG. 7 is a block diagram of a storage device according to an example.

FIG. 6 and FIG. 7 describe example storage devices that may be used with or otherwise implement the various features described herein. For example, the storage devices shown and described with respect to FIG. 6 and FIG. 7 may include various systems and components that are similar to the systems and components shown and described with respect to FIG. 1. For example, a controller 740 shown and described with respect to FIG. 7 may be similar to the controller 150 of FIG. 1. Likewise, a memory die 705 may be similar to the first memory die 165 and/or the second memory die 170 of FIG. 1.

FIG. 6 is a perspective view of a storage device 600 that includes three-dimensional (3D) stacked non-volatile memory according to an example. In this example, the storage device 600 includes a substrate 610. Blocks of memory cells are included on or above the substrate 610. The blocks may include a first block (BLK0 620) and a second block (BLK1 630). Each block may be formed of memory cells (e.g., non-volatile memory elements). The substrate 610 may also include a peripheral area 640 having support circuits that are used by the first block and the second block.

The substrate 610 may also carry circuits under the blocks, along with one or more lower metal layers which are patterned in conductive paths to carry signals from the circuits. The blocks may be formed in an intermediate region 650 of the storage device 600. The storage device may also include an upper region 660. The upper region 660 may include one or more upper metal layers that are patterned in conductive paths to carry signals from the circuits. Each block of memory cells may include a stacked area of memory cells. In an example, alternating levels of the stack represent wordlines. While two blocks are depicted, additional blocks may be used and extend in the x-direction and/or the y-direction.

In an example, a length of a plane of the substrate 610 in the x-direction represents a direction in which signal paths for wordlines or control gate lines extend (e.g., a wordline or drain-end select gate (SGD) line direction) and the width of the plane of the substrate 610 in the y-direction represents a direction in which signal paths for bit lines extend (e.g., a bit line direction). The z-direction represents a height of the storage device 600.

FIG. 7 is a functional block diagram of a storage device 700 according to an example. In an example, the storage device 700 may be the 3D stacked non-volatile storage device 600 shown and described with respect to FIG. 6. The components depicted in FIG. 7 may be electrical circuits. In an example, the storage device 700 includes one or more memory dies 705. Each of the memory die 705 includes a three-dimensional memory structure 710 of memory cells (e.g., a 3D array of memory cells), control circuitry 715, and read/write circuits 720. In another example, a two-dimensional array of memory cells may be used. The memory structure 710 is addressable by wordlines using a first decoder 725 (e.g., a row decoder) and by bit lines using a second decoder 730 (e.g., a column decoder). The read/write circuits may also include multiple sense blocks 735 including SB1, SB2, . . . , SBP. (e.g., sensing circuitry) which allow pages of the memory cells to be read or programmed in parallel. The sense blocks 735 may include bit line drivers.

In an example, a controller 740 is included in the same storage device 700 as the one or more memory dies 705. In another example, the controller 740 is formed on a die that is bonded to a memory die 705, in which case each memory die 705 may have its own controller 740. In yet another example, a controller die controls all of the memory dies 705.

Commands and data may be transferred between a host 745 and the controller 740 using a data bus 750. Commands and data may also be transferred between the controller 740 and one or more of the memory dies 705 by way of lines 755. In one example, the memory die 705 includes a set of input and/or output (I/O) pins that connect to lines 755.

The memory structure 710 may also include one or more arrays of memory cells. The memory cells may be arranged in a three-dimensional array or a two-dimensional array. The memory structure 710 may include any type of non-volatile memory that is formed on one or more physical levels of arrays of memory cells having an active area disposed above a silicon substrate. The memory structure 710 may be in a non-volatile memory device having circuitry associated with the operation of the memory cells, whether the associated circuitry is above or within the substrate.

The control circuitry 715 works in conjunction with the read/write circuits 720 to perform memory operations (e.g., erase, program, read, and others) on the memory structure 710. The control circuitry 715 may include registers, ROM fuses, and other devices for storing default values such as base voltages and other parameters.

The control circuitry 715 may also include a state machine 760, an on-chip address decoder 765, a power control module 770 and a temperature detection circuit 775. The state machine 760 may provide chip-level control of various memory operations. The state machine 760 may be programmable by software. In another example, the state machine 760 does not use software and is completely implemented in hardware (e.g., electrical circuits).

The on-chip address decoder 765 may provide an address interface between addresses used by host 745 and/or the controller 740 to a hardware address used by the first decoder 725 and the second decoder 730.

The power control module 770 may control power and voltages that are supplied to the wordlines and bit lines during memory operations. The power control module 770 may include drivers for wordline layers in a 3D configuration, select transistors (e.g., SGS and SGD transistors) and source lines. The power control module 770 may include one or more charge pumps for creating voltages.

The control circuitry 715 may also include a temperature detection circuit 775. The temperature detection circuit may be configured to detect a temperature of one or more components of the memory device 700.

The control circuitry 715, the state machine 760, the on-chip address decoder 765, the first decoder 725, the second decoder 730, the temperature detection circuit 775, the power control module 770, the sense blocks 735, the read/write circuits 720, and/or the controller 740 may be considered one or more control circuits and/or a managing circuit that perform some or all of the operations described herein.

In an example, the controller 740, is an electrical circuit that may be on-chip or off-chip. Additionally, the controller 740 may include one or more processors 780, ROM 785, RAM 790, memory interface 795, and host interface 797, all of which may be interconnected. In an example, the one or more processors 780 is one example of a control circuit. Other examples can use state machines or other custom circuits designed to perform one or more functions. Devices such as ROM 785 and RAM 790 may include code such as a set of instructions. One or more of the processors 780 may be operable to execute the set of instructions to provide some or all of the functionality described herein.

Alternatively, or additionally, one or more of the processors 780 may access code from a memory device in the memory structure 710, such as a reserved area of memory cells connected to one or more wordlines. The memory interface 795, in communication with ROM 785, RAM 790, and one or more of the processors 780, may be an electrical circuit that provides an electrical interface between the controller 740 and the memory die 705. For example, the memory interface 795 may change the format or timing of signals, provide a buffer, isolate from surges, latch I/O, and so forth.

The one or more processors 780 may issue commands to control circuitry 715, or any other component of memory die 705, using the memory interface 795. The host interface 797, in communication with the ROM 785, the RAM 795, and the one or more processors 780, may be an electrical circuit that provides an electrical interface between the controller 740 and the host 745. For example, the host interface 797 may change the format or timing of signals, provide a buffer, isolate from surges, latch I/O, and so on. Commands and data from the host 745 are received by the controller 740 by way of the host interface 797. Data sent to the host 745 may be transmitted using the data bus 750.

Multiple memory elements in the memory structure 710 may be configured so that they are connected in series or so that each element is individually accessible. By way of a non-limiting example, flash memory devices in a NAND configuration (e.g., NAND flash memory) typically contain memory elements connected in series. A NAND string is an example of a set of series-connected memory cells and select gate transistors.

A NAND flash memory array may also be configured so that the array includes multiple NAND strings. In an example, a NAND string includes multiple memory cells sharing a single bit line and are accessed as a group. Alternatively, memory elements may be configured so that each memory element is individually accessible (e.g., a NOR memory array). The NAND and NOR memory configurations are examples and memory cells may have other configurations.

The memory cells may be arranged in the single memory device level in an ordered array, such as in a plurality of rows and/or columns. However, the memory elements may be arrayed in non-regular or non-orthogonal configurations, or in structures not considered arrays.

In an example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, such as in the y direction) with each column having multiple memory cells. The vertical columns may be arranged in a two-dimensional arrangement of memory cells, with memory cells on multiple vertically stacked memory planes. Other configurations of memory elements in three dimensions can also constitute a 3D memory array.

In another example, in a 3D NAND memory array, the memory elements may be coupled together to form vertical NAND strings that traverse across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Accordingly, examples of the present disclosure describe a method, comprising: performing a read operation on multiple pages of a source memory block; determining whether a read operation error has occurred with respect to a first page of the multiple pages; based, at least in part, on determining the read operation error has occurred, performing an error correction operation on data associated with the first page to generate corrected data; storing the corrected data in a reserved memory location in an intermediate memory block; and writing, in a destination memory block, the corrected data read from the reserved memory location in the intermediate memory block and data associated with a second page of the multiple pages read from the source memory block. In an example, the method also includes determining whether a second read error operation has occurred with respect to a second page of the multiple pages; and based, at least in part, on determining the second read operation error has occurred with respect to the second page, performing a second error correction operation on data associated with the second page prior to writing the data associated with the second page to the destination memory block. In an example, the first page is read during a first reading phase and the second page is read during a second reading phase. In an example, the reserved memory location in the intermediate memory block is a subset of memory locations in the intermediate memory block. In an example, each memory location of the subset of memory locations is configured to store data associated with a single page. In an example, the intermediate memory block is a set of memory blocks including a primary memory block and a secondary memory block. In an example, the reserved memory location in the intermediate memory block is selected from a first subset of memory locations in the primary memory block and a second subset of memory locations in the secondary memory block. In an example, the first subset of memory locations includes a particular number of memory locations at a top of the first set of memory locations in the primary memory block; and the second subset of memory locations includes the particular number of memory locations at a bottom of the second set of memory locations in the secondary memory block. In an example, the corrected data is written to the reserved memory location in the intermediate memory block during a first reading phase and wherein the corrected data from the reserved memory location and the data associated with the second page is written to the destination memory block during a second reading phase. In an example, the method also includes performing an error correction operation on the second page prior to writing the second page to the destination memory block.

In another example, aspects of the present disclosure describe a system, comprising: a controller; and a memory communicatively coupled to the controller and storing instructions for performing operations, comprising: performing a read operation on a set of pages stored at a memory location of a source memory block, the set of pages including a first subset of pages, a second subset of pages, and a third subset of pages; determining whether a read operation error has occurred on the set of pages; performing an error correction operation on data associated with each page of the first subset of pages, to generate corrected data for each page of the first subset of pages, for which a read operation error has occurred; storing the corrected data of each page of the first subset of pages and data associated with each page of the second subset of pages in respective reserved memory locations in an intermediate memory block; and writing, at a memory location in a destination memory block, data stored in the intermediate memory block and data associated with the third subset of pages from the memory location in the source memory block. In an example, the instructions also include instructions for performing another error correction operation on data associated with the third subset of pages based, at least in part, on determining a read operation error has occurred with respect to the third subset of pages, the another read error correction operation being performed prior to writing the data associated with the third subset of pages to the memory location in the destination memory block. In an example, the intermediate memory block is a set of memory blocks including a primary memory block and a secondary memory block. In an example, each reserved memory location of the respective reserved memory locations in the intermediate memory block is selected from a first set of memory locations in the primary memory block or a second subset of memory locations in the secondary memory block. In an example, each reserved memory location of the respective reserved memory locations in the intermediate memory block is configured to store data associated with a single page. In an example, the source memory block is at least a multi-level cell memory block and the intermediate memory block is a single-level cell memory block.

Additional examples describe a non-volatile data storage device, comprising: at least one memory die; means for performing a read operation on multiple pages of a first memory block of the at least one memory die; means for determining whether a read operation error has occurred with respect to a first page of the multiple pages; means for performing an error correction operation on data associated with the first page, based, at least in part, on a determination that the read operation error has occurred for the first page; means for storing corrected data in a reserved memory location in an intermediate memory block after the error correction operation on data associated with the first page is successfully performed; and means for writing, in a second memory block of the at least one memory die, the corrected data read from the reserved memory location in the intermediate memory block and data associated with a second page of the multiple pages read from the first memory block. In an example, the intermediate memory block is configured to store data of one or more pages while data for a particular number of pages is available for writing in the second memory block. In an example, the intermediate memory block is configured to store a single page at a respective memory location selected from a subset of memory locations of a set of memory locations in the intermediate memory block. In an example, the non-volatile data storage device also includes means for determining whether a read operation error has occurred with respect to the second page; and means for performing the error correction operation on data associated with the second page, based, at least in part, on determining the read operation error has occurred for the second page, the error correction operation being performed before writing the data associated with the second page in the second memory block.

One of ordinary skill in the art will recognize that the technology described herein is not limited to a single specific memory structure, but covers many relevant memory structures within the spirit and scope of the technology as described herein and as understood by one of ordinary skill in the art.

The term computer-readable media as used herein may include computer storage media. Computer storage media may include volatile and nonvolatile, removable, and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information, and which can be accessed by a computing device (e.g., host device 105 (FIG. 1)). Any such computer storage media may be part of the computing device. Computer storage media does not include a carrier wave or other propagated or modulated data signal.

Additionally, examples described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various examples.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A method, comprising:
performing a read operation on multiple pages of a source memory block;
determining whether a read operation error has occurred with respect to a first page of the multiple pages;
based, at least in part, on determining the read operation error has occurred, performing an error correction operation on data associated with the first page to generate corrected data;
in response to successfully performing the error correction operation on the data associated with the first page, storing the corrected data in a reserved memory location in an intermediate memory block; and
writing, in a destination memory block, the corrected data read from the reserved memory location in the intermediate memory block and data associated with a second page of the multiple pages read from the source memory block.

2. The method of claim 1, further comprising determining whether a second read operation error has occurred with respect to a second page of the multiple pages; and
based, at least in part, on determining the second read operation error has occurred with respect to the second page, performing a second error correction operation on data associated with the second page prior to writing the data associated with the second page to the destination memory block.

3. The method of claim 2, wherein the first page is read during a first reading phase and the second page is read during a second reading phase.

4. The method of claim 1, wherein the reserved memory location in the intermediate memory block is a subset of memory locations in the intermediate memory block.

5. The method of claim 4, wherein each memory location of the subset of memory locations is configured to store data associated with a single page.

6. The method of claim 1, wherein the intermediate memory block is a set of memory blocks including a primary memory block and a secondary memory block.

7. The method of claim 6, wherein the reserved memory location in the intermediate memory block is selected from a first subset of memory locations in the primary memory block and a second subset of memory locations in the secondary memory block.

8. The method of claim 6, wherein:
the first subset of memory locations includes a particular number of memory locations at a top of the first subset of memory locations in the primary memory block; and
the second subset of memory locations includes the particular number of memory locations at a bottom of the second subset of memory locations in the secondary memory block.

9. The method of claim 1, wherein the corrected data is written to the reserved memory location in the intermediate memory block during a first reading phase and wherein the corrected data from the reserved memory location and the data associated with the second page is written to the destination memory block during a second reading phase.

10. The method of claim 9, further comprising performing an error correction operation on the second page prior to writing the second page to the destination memory block.

11. A system, comprising:
a controller; and
a memory communicatively coupled to the controller and storing instructions for performing operations, comprising:
performing a read operation on a set of pages stored at a memory location of a source memory block, the set of pages including a first subset of pages, a second subset of pages, and a third subset of pages;
determining whether a read operation error has occurred on the set of pages;
performing an error correction operation on data associated with each page of the first subset of pages, to generate corrected data for each page of the first subset of pages, for which a read operation error has occurred;
storing the corrected data of each page of the first subset of pages and data associated with each page of the second subset of pages in respective reserved memory locations in an intermediate memory block; and
writing, at a memory location in a destination memory block, data stored in the intermediate memory block and data associated with the third subset of pages from the memory location in the source memory block.

12. The system of claim 11, further comprising instructions for performing another error correction operation on data associated with the third subset of pages based, at least in part, on determining a read operation error has occurred with respect to the third subset of pages, the another read error correction operation being performed prior to writing the data associated with the third subset of pages to the memory location in the destination memory block.

13. The system of claim 11, wherein the intermediate memory block is a set of memory blocks including a primary memory block and a secondary memory block.

14. The system of claim 13, wherein each reserved memory location of the respective reserved memory locations in the intermediate memory block is selected from a first subset of memory locations in the primary memory block or a second subset of memory locations in the secondary memory block.

15. The system of claim 13, wherein each reserved memory location of the respective reserved memory locations in the intermediate memory block is configured to store data associated with a single page.

16. The system of claim 13, wherein the source memory block is at least a multi-level cell memory block and the intermediate memory block is a single-level cell memory block.

17. A non-volatile data storage device, comprising:
at least one memory die;
means for performing a read operation on multiple pages of a first memory block of the at least one memory die;
means for determining whether a read operation error has occurred with respect to a first page of the multiple pages;

means for performing an error correction operation on data associated with the first page, based, at least in part, on a determination that the read operation error has occurred for the first page;

means for storing corrected data in a reserved memory location in an intermediate memory block after the error correction operation on data associated with the first page is successfully performed; and means for writing, in a second memory block of the at least one memory die, the corrected data read from the reserved memory location in the intermediate memory block and data associated with a second page of the multiple pages read from the first memory block.

18. The non-volatile data storage device of claim 17, wherein the intermediate memory block is configured to store data of one or more pages while data for a particular number of pages is available for writing in the second memory block.

19. The non-volatile data storage device of claim 17, wherein the intermediate memory block is configured to store a single page at a respective memory location selected from a subset of memory locations of a set of memory locations in the intermediate memory block.

20. The non-volatile data storage device of claim 17, further comprising:

means for determining whether a read operation error has occurred with respect to the second page; and means for performing the error correction operation on data associated with the second page, based, at least in part, on determining the read operation error has occurred for the second page, the error correction operation being performed before writing the data associated with the second page in the second memory block.

* * * * *